United States Patent
Lotfi et al.

(10) Patent No.: US 8,266,793 B2
(45) Date of Patent: Sep. 18, 2012

(54) MODULE HAVING A STACKED MAGNETIC DEVICE AND SEMICONDUCTOR DEVICE AND METHOD OF FORMING THE SAME

(75) Inventors: Ashraf W. Lotfi, Bridgewater, NJ (US); Douglas Dean Lopata, Boyertown, PA (US); John David Weld, Ledgewood, NJ (US); Mathew A. Wilkowski, Nazareth, PA (US)

(73) Assignee: Enpirion, Inc., Hampton, NJ (US)

( * ) Notice: Subject to any disclaimer, the term of this patent is extended or adjusted under 35 U.S.C. 154(b) by 43 days.

(21) Appl. No.: 12/393,835

(22) Filed: Feb. 26, 2009

(65) Prior Publication Data
US 2010/0212150 A1    Aug. 26, 2010

Related U.S. Application Data

(63) Continuation-in-part of application No. 12/244,672, filed on Oct. 2, 2008, now Pat. No. 8,153,473.

(51) Int. Cl.
*H05K 3/30* (2006.01)
*H05K 3/20* (2006.01)
*H05K 3/02* (2006.01)
*H05K 3/10* (2006.01)

(52) U.S. Cl. .............. 29/832; 29/831; 29/841; 29/846

(58) Field of Classification Search ............... 29/832, 29/831, 834, 841, 846, 854, 855; 174/255; 257/335, 336, 528, 686; 336/90
See application file for complete search history.

(56) References Cited

U.S. PATENT DOCUMENTS

| | | | |
|---|---|---|---|
| 1,889,398 | A | 11/1932 | Bishop |
| 2,600,473 | A | 6/1952 | Brockman |
| 3,210,707 | A | 10/1965 | Constantakes |
| 3,691,497 | A | 9/1972 | Bailey et al. |
| 3,762,039 | A | 10/1973 | Douglass et al. |
| 3,902,148 | A | 8/1975 | Drees et al. |
| 3,908,264 | A | 9/1975 | Friberg et al. |
| 3,947,699 | A * | 3/1976 | Whitmer .................. 327/72 |
| 4,101,389 | A | 7/1978 | Uedaira |
| 4,103,267 | A | 7/1978 | Olschewski |
| 4,187,128 | A | 2/1980 | Billings et al. |
| 4,199,743 | A | 4/1980 | Martincic |

(Continued)

FOREIGN PATENT DOCUMENTS

DE    10022980    12/2000

(Continued)

OTHER PUBLICATIONS

Betancourt-Zamora, R.J., et al., "A 1.5 mW, 200 MHz CMOS VCO for Wireless Biotelemetry," First International Workshop on Design of Mixed-Mode Integrated Circuits and Applications, Jul. 1997, pp. 72-74, Cancun, Mexico.

(Continued)

*Primary Examiner* — David Angwin
(74) *Attorney, Agent, or Firm* — Slater & Matsil, L.L.P.

(57) ABSTRACT

A module having a stacked magnetic device and semiconductor device, and method of forming the same. In one embodiment, the module includes a printed wiring board including a patterned conductor formed on an upper surface thereof. The module also includes a magnetic core mounted on the upper surface of the printed wiring board proximate the patterned conductor and a semiconductor device mounted on an upper surface of the magnetic core.

20 Claims, 12 Drawing Sheets

U.S. PATENT DOCUMENTS

| | | | |
|---|---|---|---|
| 4,349,862 A * | 9/1982 | Bajorek et al. | 361/762 |
| 4,433,927 A | 2/1984 | Cavallari | |
| 4,455,545 A * | 6/1984 | Shelly | 336/200 |
| 4,586,436 A | 5/1986 | Denney et al. | |
| 4,636,752 A | 1/1987 | Saito | |
| 4,668,310 A | 5/1987 | Kudo et al. | |
| 4,681,718 A | 7/1987 | Oldham | |
| 4,751,199 A | 6/1988 | Phy | |
| 4,754,317 A | 6/1988 | Comstock et al. | |
| 4,777,465 A | 10/1988 | Meinel | |
| 4,808,118 A | 2/1989 | Wilson et al. | |
| 4,847,986 A | 7/1989 | Meinel | |
| 4,870,224 A | 9/1989 | Smith et al. | |
| 4,878,291 A * | 11/1989 | Suguri | 29/606 |
| 4,916,522 A | 4/1990 | Cohn | |
| 4,967,156 A * | 10/1990 | Seitz | 324/249 |
| 4,975,671 A | 12/1990 | Dirks | |
| 5,056,214 A | 10/1991 | Holt | |
| 5,059,278 A | 10/1991 | Cohen et al. | |
| 5,096,513 A | 3/1992 | Sawa et al. | |
| 5,118,298 A | 6/1992 | Murphy | |
| 5,161,098 A | 11/1992 | Balakrishnan | |
| 5,187,119 A | 2/1993 | Cech et al. | |
| 5,262,296 A | 11/1993 | Ogawa et al. | |
| 5,279,988 A | 1/1994 | Saadat et al. | |
| 5,285,369 A | 2/1994 | Balakrishnan | |
| 5,345,670 A | 9/1994 | Pitzele et al. | |
| 5,353,001 A | 10/1994 | Meinel et al. | |
| 5,428,245 A | 6/1995 | Lin et al. | |
| 5,430,613 A * | 7/1995 | Hastings et al. | 361/760 |
| 5,436,409 A | 7/1995 | Sawada et al. | |
| 5,469,334 A | 11/1995 | Balakrishnan | |
| 5,484,494 A | 1/1996 | Oda et al. | |
| 5,524,334 A | 6/1996 | Boesel | |
| 5,543,773 A * | 8/1996 | Evans et al. | 336/183 |
| 5,561,438 A | 10/1996 | Nakazawa et al. | |
| 5,574,273 A | 11/1996 | Nakagawa et al. | |
| 5,574,420 A | 11/1996 | Roy et al. | |
| 5,578,261 A | 11/1996 | Manzione et al. | |
| 5,692,296 A | 12/1997 | Variot | |
| 5,751,528 A * | 5/1998 | Nepela et al. | 360/125.5 |
| 5,783,025 A | 7/1998 | Hwang et al. | |
| 5,787,569 A * | 8/1998 | Lotfi et al. | 29/602.1 |
| 5,788,854 A | 8/1998 | Desaigoudar et al. | |
| 5,802,702 A | 9/1998 | Fleming et al. | |
| 5,807,959 A | 9/1998 | Wu et al. | |
| 5,834,691 A | 11/1998 | Aoki | |
| 5,835,350 A | 11/1998 | Stevens | |
| 5,837,155 A * | 11/1998 | Inagaki et al. | 216/18 |
| 5,846,441 A | 12/1998 | Roh | |
| 5,898,991 A | 5/1999 | Fogel et al. | |
| 5,920,249 A | 7/1999 | Huss | |
| 5,973,923 A | 10/1999 | Jitaru | |
| 5,998,925 A | 12/1999 | Shimizu et al. | |
| 6,005,377 A | 12/1999 | Chen et al. | |
| 6,005,467 A * | 12/1999 | Abramov | 336/200 |
| 6,060,176 A | 5/2000 | Semkow et al. | |
| 6,081,997 A | 7/2000 | Chia et al. | |
| 6,087,920 A * | 7/2000 | Abramov | 336/192 |
| 6,087,921 A * | 7/2000 | Morrison | 336/200 |
| 6,094,123 A | 7/2000 | Roy | |
| 6,101,218 A * | 8/2000 | Nagano | 375/224 |
| 6,118,351 A | 9/2000 | Kossives et al. | |
| 6,118,360 A | 9/2000 | Neff | |
| 6,143,157 A * | 11/2000 | Andrus et al. | 205/205 |
| 6,160,721 A | 12/2000 | Kossives et al. | |
| 6,165,340 A * | 12/2000 | Andrus et al. | 205/118 |
| 6,246,311 B1 * | 6/2001 | Finnemore et al. | 336/192 |
| 6,255,714 B1 | 7/2001 | Kossives et al. | |
| 6,317,948 B1 * | 11/2001 | Kola et al. | 29/25.42 |
| 6,353,379 B1 | 3/2002 | Busletta et al. | |
| 6,362,714 B1 * | 3/2002 | Rice et al. | 336/179 |
| 6,366,486 B1 | 4/2002 | Chen et al. | |
| 6,440,750 B1 | 8/2002 | Feygenson et al. | |
| 6,448,640 B2 * | 9/2002 | Corisis | 257/691 |
| 6,466,454 B1 | 10/2002 | Jitaru | |
| 6,479,981 B2 | 11/2002 | Schweitzer, Jr. et al. | |
| 6,495,019 B1 | 12/2002 | Filas et al. | |
| 6,541,819 B2 * | 4/2003 | Lotfi et al. | 257/335 |
| 6,549,409 B1 | 4/2003 | Saxelby, Jr. et al. | |
| 6,552,629 B2 * | 4/2003 | Dixon et al. | 333/172 |
| 6,578,253 B1 | 6/2003 | Herbert | |
| 6,608,332 B2 | 8/2003 | Shimizu et al. | |
| 6,621,137 B1 * | 9/2003 | Ma et al. | 257/528 |
| 6,624,498 B2 | 9/2003 | Filas et al. | |
| 6,649,422 B2 | 11/2003 | Kossives et al. | |
| 6,691,398 B2 | 2/2004 | Gutierrez | |
| 6,693,805 B1 * | 2/2004 | Steigerwald et al. | 363/39 |
| 6,731,002 B2 | 5/2004 | Choi | |
| 6,747,538 B2 | 6/2004 | Kuwata et al. | |
| 6,750,403 B2 * | 6/2004 | Peterson | 174/255 |
| 6,775,901 B1 * | 8/2004 | Lee et al. | 29/602.1 |
| 6,790,379 B2 | 9/2004 | Aoki et al. | |
| 6,912,781 B2 | 7/2005 | Morrison et al. | |
| 6,922,130 B2 | 7/2005 | Okamoto | |
| 6,989,121 B2 | 1/2006 | Thummel | |
| 6,998,952 B2 | 2/2006 | Zhou et al. | |
| 6,998,953 B2 * | 2/2006 | Yeo et al. | 336/200 |
| 7,009,486 B1 * | 3/2006 | Goeke et al. | 336/229 |
| 7,015,544 B2 * | 3/2006 | Lotfi et al. | 257/336 |
| 7,019,505 B2 | 3/2006 | Dwarakanath et al. | |
| 7,020,295 B2 | 3/2006 | Hamada et al. | |
| 7,021,518 B2 | 4/2006 | Kossives et al. | |
| 7,023,315 B2 | 4/2006 | Yeo et al. | |
| 7,038,438 B2 | 5/2006 | Dwarakanath et al. | |
| 7,057,486 B2 | 6/2006 | Kiko | |
| 7,101,737 B2 | 9/2006 | Cobbley | |
| 7,151,228 B2 * | 12/2006 | Takase et al. | 174/255 |
| 7,157,984 B2 * | 1/2007 | McCorquodale et al. | 331/167 |
| 7,175,718 B2 | 2/2007 | Nobutoki et al. | |
| 7,180,395 B2 * | 2/2007 | Lotfi et al. | 336/90 |
| 7,183,622 B2 * | 2/2007 | Heck et al. | 257/528 |
| 7,214,985 B2 * | 5/2007 | Lotfi et al. | 257/336 |
| 7,229,886 B2 | 6/2007 | Lotfi et al. | |
| 7,230,302 B2 * | 6/2007 | Lotfi et al. | 257/369 |
| 7,230,316 B2 | 6/2007 | Yamazaki et al. | |
| 7,232,733 B2 | 6/2007 | Lotfi et al. | |
| 7,236,086 B1 | 6/2007 | Vinciarelli et al. | |
| 7,244,994 B2 | 7/2007 | Lotfi et al. | |
| 7,250,842 B1 | 7/2007 | Johnson et al. | |
| 7,256,674 B2 * | 8/2007 | Lotfi et al. | 336/90 |
| 7,276,998 B2 * | 10/2007 | Lotfi et al. | 336/90 |
| 7,330,017 B2 | 2/2008 | Dwarakanath et al. | |
| 7,426,780 B2 * | 9/2008 | Lotfi et al. | 29/602.1 |
| 7,434,306 B2 | 10/2008 | Gardner | |
| 7,462,317 B2 * | 12/2008 | Lotfi et al. | 264/272.16 |
| 7,498,522 B2 * | 3/2009 | Itoh | 174/255 |
| 7,521,907 B2 * | 4/2009 | Cervera et al. | 323/268 |
| 7,544,995 B2 | 6/2009 | Lotfi et al. | |
| 7,642,762 B2 * | 1/2010 | Xie et al. | 323/282 |
| 7,688,172 B2 | 3/2010 | Lotfi et al. | |
| 7,786,837 B2 | 8/2010 | Hebert | |
| 7,791,440 B2 | 9/2010 | Ramadan et al. | |
| 7,876,572 B2 * | 1/2011 | Sota | 361/777 |
| 7,920,042 B2 | 4/2011 | Lotfi et al. | |
| 7,936,160 B1 * | 5/2011 | Sheehan | 323/285 |
| 7,948,772 B2 * | 5/2011 | Tung et al. | 361/818 |
| 7,952,459 B2 | 5/2011 | Lotfi et al. | |
| 7,955,868 B2 | 6/2011 | Lotfi et al. | |
| 7,974,103 B2 * | 7/2011 | Lim et al. | 361/777 |
| 2001/0018797 A1 * | 9/2001 | Shepherd | 29/830 |
| 2001/0030595 A1 | 10/2001 | Hamatani et al. | |
| 2001/0041384 A1 | 11/2001 | Ohgiyama et al. | |
| 2002/0153258 A1 | 10/2002 | Filas et al. | |
| 2003/0002265 A1 * | 1/2003 | Simmons | 361/749 |
| 2003/0062541 A1 | 4/2003 | Warner | |
| 2003/0076662 A1 | 4/2003 | Miehling | |
| 2003/0232196 A1 | 12/2003 | Anand et al. | |
| 2004/0130428 A1 | 7/2004 | Mignano et al. | |
| 2004/0150500 A1 | 8/2004 | Kiko | |
| 2005/0011672 A1 | 1/2005 | Alawani et al. | |
| 2005/0103112 A1 * | 5/2005 | Pedersen et al. | 73/718 |
| 2005/0167756 A1 * | 8/2005 | Lotfi et al. | 257/369 |
| 2005/0168203 A1 | 8/2005 | Dwarakanath et al. | |
| 2005/0168205 A1 | 8/2005 | Dwarakanath et al. | |
| 2005/0169024 A1 | 8/2005 | Dwarakanath et al. | |
| 2005/0212132 A1 | 9/2005 | Hsuan et al. | |

| | | | |
|---|---|---|---|
| 2006/0001123 A1* | 1/2006 | Heck et al. ............... 257/528 |
| 2006/0009023 A1 | 1/2006 | Nair et al. |
| 2006/0038225 A1* | 2/2006 | Lotfi et al. ............... 257/335 |
| 2006/0040449 A1 | 2/2006 | Lotfi et al. |
| 2006/0040452 A1 | 2/2006 | Lotfi et al. |
| 2006/0081937 A1 | 4/2006 | Lotfi et al. |
| 2006/0096087 A1* | 5/2006 | Lotfi et al. ............... 29/841 |
| 2006/0096088 A1* | 5/2006 | Lotfi et al. ............... 29/841 |
| 2006/0097831 A1* | 5/2006 | Lotfi et al. ............... 336/84 C |
| 2006/0097832 A1* | 5/2006 | Lotfi et al. ............... 336/90 |
| 2006/0097833 A1* | 5/2006 | Lotfi et al. ............... 336/90 |
| 2006/0109072 A1 | 5/2006 | Giandalia et al. |
| 2006/0145800 A1 | 7/2006 | Dadafshar et al. |
| 2006/0197207 A1 | 9/2006 | Chow et al. |
| 2007/0025092 A1* | 2/2007 | Lee et al. ............... 361/761 |
| 2007/0074386 A1* | 4/2007 | Lotfi et al. ............... 29/608 |
| 2007/0075815 A1* | 4/2007 | Lotfi et al. ............... 336/200 |
| 2007/0075816 A1* | 4/2007 | Lotfi et al. ............... 336/200 |
| 2007/0075817 A1* | 4/2007 | Lotfi et al. ............... 336/200 |
| 2007/0246808 A1 | 10/2007 | Ewe et al. |
| 2008/0001701 A1 | 1/2008 | Gardner et al. |
| 2008/0090079 A1 | 4/2008 | Fajardo et al. |
| 2008/0258274 A1 | 10/2008 | Sinaga et al. |
| 2008/0258278 A1 | 10/2008 | Ramos et al. |
| 2008/0301929 A1* | 12/2008 | Lotfi et al. ............... 29/602.1 |
| 2008/0303131 A1* | 12/2008 | McElrea et al. ............... 257/686 |
| 2009/0004774 A1 | 1/2009 | Lee et al. |
| 2009/0057822 A1 | 3/2009 | Wen et al. |
| 2009/0065964 A1 | 3/2009 | Lotfi et al. |
| 2009/0066300 A1 | 3/2009 | Lotfi et al. |
| 2009/0066467 A1 | 3/2009 | Lotfi et al. |
| 2009/0066468 A1 | 3/2009 | Lotfi et al. |
| 2009/0068347 A1 | 3/2009 | Lotfi et al. |
| 2009/0068400 A1 | 3/2009 | Lotfi et al. |
| 2009/0068761 A1 | 3/2009 | Lotfi et al. |
| 2009/0146297 A1* | 6/2009 | Badakere et al. ............... 257/737 |
| 2010/0084750 A1 | 4/2010 | Lotfi et al. |
| 2010/0164449 A1 | 7/2010 | Dwarakanath et al. |
| 2010/0164650 A1 | 7/2010 | Abou-Alfotouh et al. |
| 2010/0212150 A1 | 8/2010 | Lotfi et al. |
| 2010/0214746 A1 | 8/2010 | Lotfi et al. |

FOREIGN PATENT DOCUMENTS

| | | |
|---|---|---|
| GB | 2 041 818 A | 9/1980 |
| JP | 01072517 | 3/1989 |
| JP | 2-228013 A | 9/1990 |
| JP | 5-314885 | 11/1993 |
| JP | 6-251958 | 9/1994 |
| JP | 06-251958 A | 9/1994 |

OTHER PUBLICATIONS

Goodman, J., et al., "An Energy/Security Scalable Encryption Processor Using an Embedded Variable Voltage DC/DC Converter," IEEE Journal of Solid-State Circuits, Nov. 1998, pp. 1799-1809, vol. 33, No. 11, IEEE, Los Alamitos, CA.

Horowitz, P., et al., "The Art of Electronics," Second Edition, 1989, Chapter 5: Active Filters and Oscillators, pp. 288-291, Cambridge University Press, Cambridge, MA.

Lotfi, A.W., et al., "Issues and Advances in High-Frequency Magnetics for Switching Power Supplies," Proceedings of the IEEE, Jun. 2001, pp. 833-845, vol. 89, No. 6, IEEE, Los Alamitos, CA.

Sato, M., et al., "Influences of Molding Conditions on Die-pad Behavior in IC Encapsulation Process Analyzed by Hall Element Method," IEEE Transactions on Advanced Packaging, Aug. 2000, pp. 574-581, vol. 23, No. 3, IEEE, Los Alamitos, CA.

"Technical Specification: PMF 8000 Series: POL Regulator, Input 10.8-13.2 V, Output 10 A/55 W," EN/LZT 146 318 R1C, Sep. 2006, pp. 1-47, Ericsson Power Modules AB, Stockholm, Sweden.

* cited by examiner

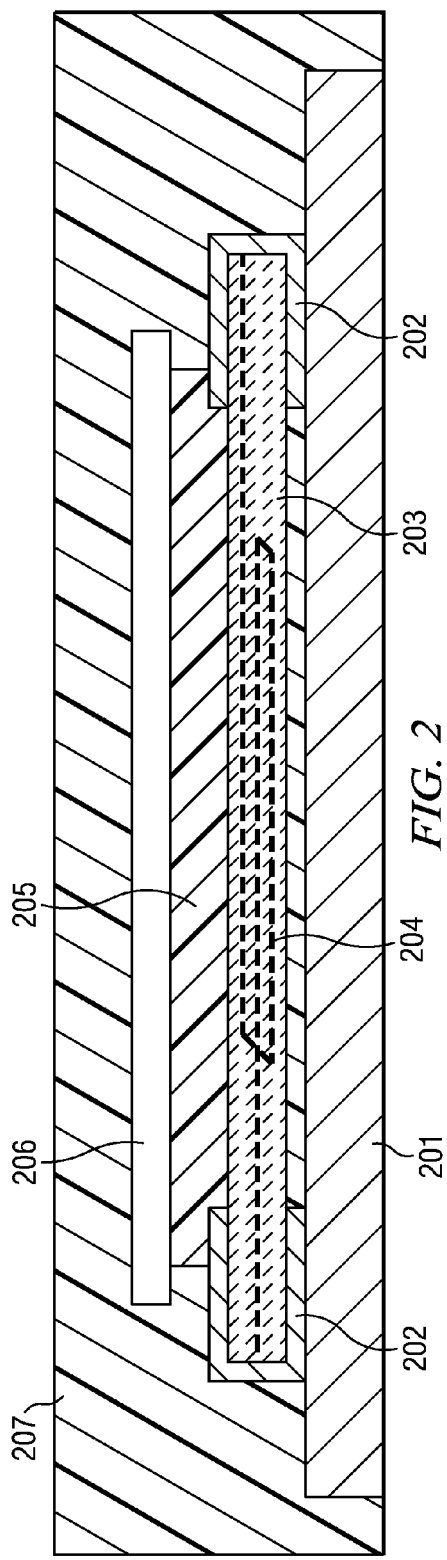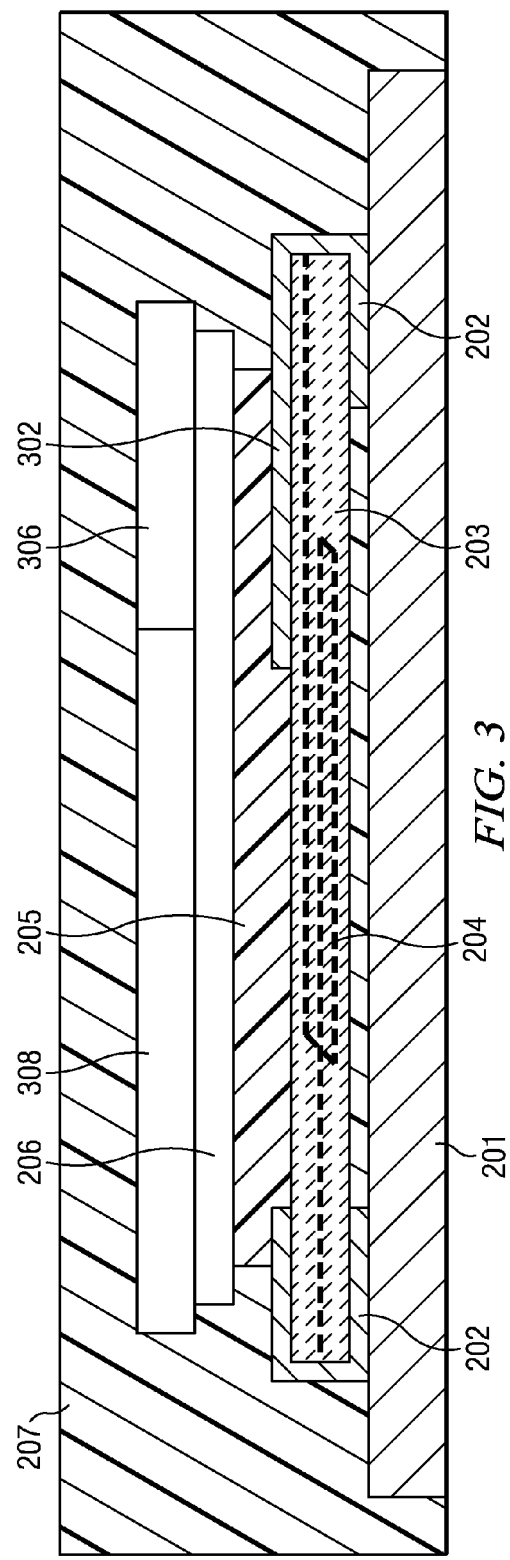

MODULE HAVING A STACKED MAGNETIC DEVICE AND SEMICONDUCTOR DEVICE AND METHOD OF FORMING THE SAME

This application is a continuation in part of, and claims priority to, U.S. patent application Ser. No. 12/244,672, entitled "Module Having a Stacked Passive Element and Method of Forming the Same," filed on Oct. 2, 2008 now U.S. Pat. No. 8,153,473, which is incorporated herein by reference.

TECHNICAL FIELD

The present invention is directed, in general, to electronic devices and, in particular, to a stacked magnetic device and semiconductor device in a module, and related methods of forming the same.

BACKGROUND

Magnetic devices such as inductors are often used in circuit design for electronic devices (e.g., power modules) in which energy is stored in a magnetic field surrounding an electrically conductive element such as a coil of copper wire. To produce an inductor that can store a useful amount of energy for a given size and a given current level, a number of electrically conductive turns or wires are formed around a magnetic structure or core such as a layer of magnetic material. The magnetic field is enhanced by the permeability of the magnetic material and by the presence of the multiple conductive turns. As the size of electronic devices has been reduced by using integrated circuits and printed wiring boards with surface-mount assembly techniques, the size of inductors has not, to date, decreased proportionately. Thus, the size of magnetic structures generally dominates the size of present electronic power modules.

Substantial progress has been made in recent years in integrating control circuits including operational amplifiers, comparators, and passive circuit elements, with active elements such as field-effect transistors. An area that has been more challenging is to produce a power module that includes larger passive elements, such as inductors, that are difficult to include in an integrated circuit, with an active element that may include control circuit elements and passive elements such as resistors on the same die. The integration of larger passive elements such as inductors with an active element would enable the production of very compact power modules.

A characteristic that affects broad market acceptance of a power module is its physical size, which introduces thermal design challenges. A continuing area affecting the design of a compact power module that requires further progress is the ability to dissipate the heat produced by passive circuit elements in a compact physical structure, as well as the heat produced by active elements. The dissipation of heat from these sources is performed in a challenging external thermal environment without compromising a power rating of the power module.

A number of approaches have been used in the past to reduce the size of a power module. For instance, U.S. Pat. No. 5,574,420 entitled "Low Profile Surface Mounted Magnetic Devices and Components Therefor," to Roy, et al., issued Nov. 12, 1996, which is incorporated herein by reference, discloses a magnetic device that forms conductive pathways in a body of magnetic material, adds windings by inserting staple-like conductive piece parts through apertures in the body, and solders the staples to a patterned printed wiring board placed below a ceramic magnetic bar to complete the winding structure. Each of the magnetic devices disclosed in the aforementioned references suffers from a current limitation therefor, which is an impractical design and manufacturing approach for a mass market. The aforementioned magnetic devices also provide inadequate heat dissipation capability or reduction in the size thereof.

Another approach is disclosed in a technical specification from Ericsson designated "EN/LZT 146 318 R1C," September 2006 for PMF 8000 series point of load ("POL") regulators, which is incorporated herein by reference. As illustrated on the first page of the technical specification, the PMF 8000 series POL regulators provides a magnetic component of large size and discrete implementation without any heat removal capability causing an inadequate ability to shrink the size of the device or remove heat therefrom. Another approach is disclosed in U.S. Pat. No. 6,366,486 entitled "Power Supply Device for Enhancing Heat-Dissipating Effect," to Chen, et al. ("Chen"), issued Apr. 2, 2002, which is incorporated herein by reference. A package of Chen includes a printed circuit board, a transformer, an inductor having an inductive winding, a metal strip electrically connected to the inductive winding, and a converter electrically connected to the metal strip and covered by the metal strip. The aforementioned magnetic device also provides inadequate heat dissipation capability or reduction in the size of a power module.

Thus, the designs for power modules of the past are inadequate to produce a sufficiently miniaturized, high-density device with a substantial power rating. The power modules should be more compact than presently achievable designs. The design of power modules is inadequately served by these aforementioned limitations. In addition, a power module integrable with manufacturing processes of a commensurate end product would provide substantial cost savings therefor.

Accordingly, what is needed in the art is a power module, and related method of forming the same, that can meet the more stringent requirements of present applications such as compactness, efficiency and high power density, while being manufacturable at high volume and with lower cost than is achieved with conventional design approaches.

SUMMARY OF THE INVENTION

These and other problems are generally solved or circumvented, and technical advantages are generally achieved, by advantageous embodiments of the present invention, which include a module having a stacked magnetic device and semiconductor device, and method of forming the same. In one embodiment, the module (e.g., a power module) includes a printed wiring board including a patterned conductor formed on an upper surface thereof. The module also includes a magnetic core mounted on the upper surface of the printed wiring board proximate the patterned conductor and a semiconductor device mounted on an upper surface of the magnetic core.

In another aspect, the present invention provides a method of forming a module (e.g., a power module) including providing a printed wiring board and forming a patterned conductor on an upper surface of the printed wiring board. The method also includes mounting a magnetic core on the upper surface of the printed wiring board proximate the patterned conductor and mounting a semiconductor device on an upper surface of the magnetic core.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates an elevational view of an embodiment of a surface-mount power module formed with a discrete passive element constructed according to the principles of the present invention;

FIG. 3 illustrates an elevational view of another embodiment of a surface-mount power module formed with a discrete passive element constructed according to the principles of the present invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to alternative embodiments in a specific context, namely, a power module (e.g., an electronic device) including a discrete or separate passive element and a semiconductor device, and a method of manufacture therefor. While the principles of the present invention will be described in the environment of a power module, any application that may benefit from a semiconductor device mounted on a discrete passive element as described herein is well within the broad scope of the present invention.

As will become more apparent, a discrete passive element may be embodied, without limitation, in an inductor or a transformer. In addition, a semiconductor device may include active elements (e.g., a switch) and passive elements (e.g., diodes, resistors, capacitors) and circuits such as controllers with control circuit elements such as operational amplifiers and comparators. Of course, the broad scope of the present invention is not limited to the particular elements that form the semiconductor device.

In addition to the passive and active elements, the semiconductor device may include integrated circuits (either in bare die or in module form) coupled (e.g., adhesively mounted) to a conductive substrate, and electrically coupled thereto with wire bonds, as well as surface-mount elements coupled thereon. An encapsulant such as plastic molded material, for example, an epoxy material, is placed around the discrete passive element and the semiconductor device, and any additional elements to provide environmental and mechanical protection as well as a thermally conductive covering to facilitate heat dissipation during operation of the power module. Other molding materials and processes as well as electronic devices constructed without an encapsulant are well within the broad scope of the present invention. It should be understood that the power module may form, at least in part, a power management system, which itself is often referred to as a power management integrated circuit.

Figure 1:
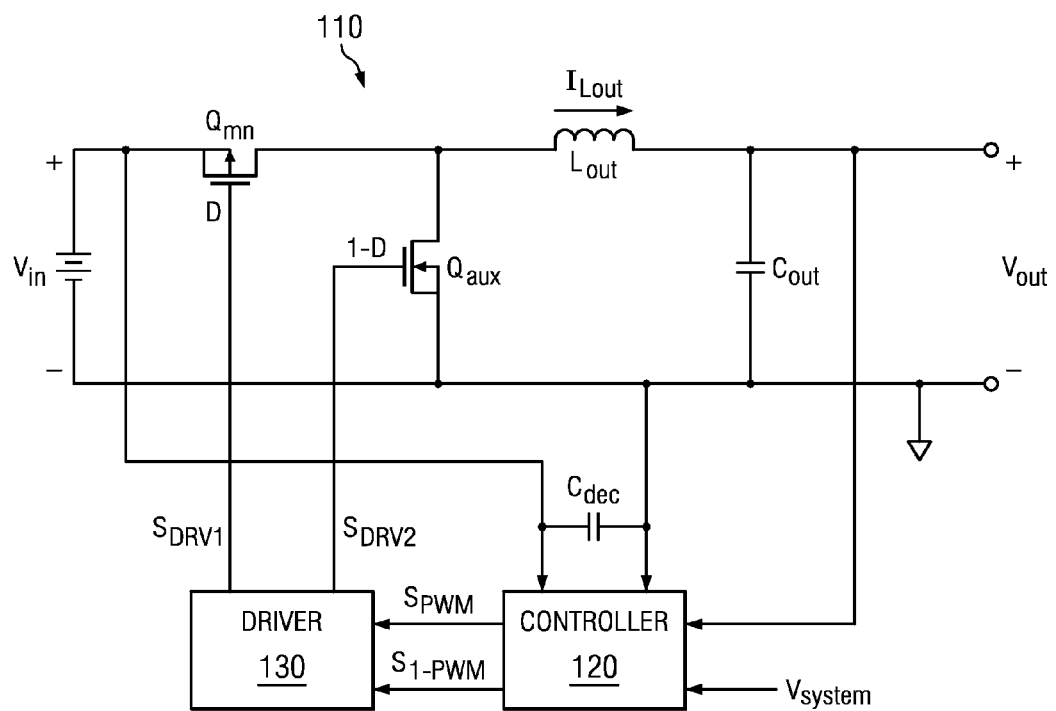
FIG. 1 illustrates a schematic diagram of an embodiment of a power converter including power conversion circuitry employable in a power module constructed according to the principles of the present invention.

Referring initially to FIG. 1, illustrated is a schematic diagram of an embodiment of a power converter including power conversion circuitry employable in a power module constructed according to the principles of the present invention. The power converter includes a power train 110, a controller 120 and a driver 130 including control circuit elements, and provides power to a system such as a microprocessor. While in the illustrated embodiment, the power train 110 employs a buck converter topology, those skilled in the art should understand that other converter topologies such as a forward converter topology are well within the broad scope of the present invention.

The power train 110 receives an input voltage $V_{in}$ from a source of electrical power (represented by a battery) at an input thereof and provides a regulated output voltage $V_{out}$ to power, for instance, a microprocessor at an output thereof. In keeping with the principles of a buck converter topology, the output voltage $V_{out}$ is generally less than the input voltage $V_{in}$ such that a switching operation of the power converter can regulate the output voltage $V_{out}$. An active element such as a switch (e.g., a main switch $Q_{mn}$) is enabled to conduct for a primary interval (generally co-existent with a primary duty cycle "D" of the main switch $Q_{mn}$) and couples the input voltage $V_{in}$ to an output filter inductor $L_{out}$. During the primary interval, an inductor current $I_{Lout}$ flowing through the output filter inductor $L_{out}$ increases as a current flows from the input to the output of the power train 110. A portion of the inductor current $I_{Lout}$ is filtered by the output capacitor $C_{out}$.

During a complementary interval (generally co-existent with a complementary duty cycle "1-D" of the main switch $Q_{mn}$), the main switch $Q_{mn}$ is transitioned to a non-conducting state and another active element such as another switch (e.g., an auxiliary switch $Q_{aux}$) is enabled to conduct. The auxiliary switch $Q_{aux}$ provides a path to maintain a continuity of the inductor current $I_{Lout}$ flowing through the output filter inductor $L_{out}$. During the complementary interval, the inductor current $I_{Lout}$ through the output filter inductor $L_{out}$ decreases. In general, the duty cycle of the main and auxiliary switches $Q_{mn}$, $Q_{aux}$ may be adjusted to maintain a regulation of the output voltage $V_{out}$ of the power converter. Those skilled in the art should understand, however, that the conduction periods for the main and auxiliary switches $Q_{mn}$, $Q_{aux}$ may be separated by a small time interval to avoid cross conduction therebetween and beneficially to reduce the switching losses associated with the power converter.

The controller 120 receives a desired characteristic such as a desired system voltage $V_{system}$ from an internal or external source associated with the microprocessor, and the output voltage $V_{out}$ of the power converter. The controller 120 is also coupled to the input voltage $V_{in}$ of the power converter and a return lead of the source of electrical power (again, represented by a battery) to provide a ground connection therefor. A decoupling capacitor $C_{dec}$ is coupled to the path from the input voltage $V_{in}$ to the controller 120. The decoupling capacitor $C_{dec}$ is configured to absorb high frequency noise signals associated with the source of electrical power to protect the controller 120.

In accordance with the aforementioned characteristics, the controller 120 provides a signal (e.g., a pulse width modulated signal $S_{PWM}$) to control a duty cycle and a frequency of the main and auxiliary switches $Q_{mn}$, $Q_{aux}$ of the power train 110 to regulate the output voltage $V_{out}$ thereof. The controller 120 may also provide a complement of the signal (e.g., a complementary pulse width modulated signal $S_{1-PWM}$) in accordance with the aforementioned characteristics. Any controller adapted to control at least one switch of the power converter is well within the broad scope of the present invention. As an example, a controller employing digital circuitry is disclosed in U.S. Pat. No. 7,038,438, entitled "Controller for a Power Converter and a Method of Controlling a Switch Thereof," to Dwarakanath, et al. and U.S. Pat. No. 7,019,505, entitled "Digital Controller for a Power Converter Employing Selectable Phases of a Clock Signal," to Dwarakanath, et al., which are incorporated herein by reference.

The power converter also includes the driver 130 configured to provide drive signals $S_{DRV1}$, $S_{DRV2}$ to the main and auxiliary switches $Q_{mn}$, $Q_{aux}$, respectively, based on the signals $S_{PWM}$, $S_{1-PWM}$ provided by the controller 120. There are a number of viable alternatives to implement a driver 130 that include techniques to provide sufficient signal delays to prevent crosscurrents when controlling multiple switches in the power converter. The driver 130 typically includes active elements such as switching circuitry incorporating a plurality of driver switches that cooperate to provide the drive signals $S_{DRV1}$, $S_{DRV2}$ to the main and auxiliary switches $Q_{mn}$, $Q_{aux}$. Of course, any driver 130 capable of providing the drive signals $S_{DRV1}$, $S_{DRV2}$ to control a switch is well within the broad scope of the present invention. As an example, a driver is disclosed in U.S. Pat. No. 7,330,017, entitled "Driver for a Power Converter and Method of Driving a Switch Thereof," to Dwarakanath, et al., which is incorporated herein by reference. Also, an embodiment of a semiconductor device that may embody portions of the power conversion circuitry is disclosed in U.S. Pat. No. 7,230,302, entitled "Laterally Diffused Metal Oxide Semiconductor Device and Method of Forming the Same," to Lotfi, et al., which is incorporated herein by reference, and an embodiment of an integrated circuit embodying power conversion circuitry, or portions thereof, is disclosed in U.S. Pat. No. 7,015,544, entitled "Integrated Circuit Employable with a Power Converter," to Lotfi, et al, which is incorporated by reference.

Turning now to FIG. 2, illustrated is an elevational view of an embodiment of a surface-mount power module formed with a discrete passive element, such as an inductor soldered to a leadframe 201, constructed according to the principles of the present invention. The discrete passive element includes a main body 203 that may be formed with a ceramic material with metallic ends 202 thereof. The metallic ends 202 of the main body 203 of the discrete passive element are generally tinned to enable surface-mount soldering to the leadframe 201. The discrete passive element may include a magnetic device such as an inductor formed with an electrically conductive loop 204 embedded in a magnetic material such as a soft ferrite to form the main body 203. A top surface of the metallic ends 202 of the main body 203 are generally slightly elevated from the top surface of a central portion of the main body 203 of the discrete passive element. The leadframe 201 may be formed as a patterned, conductive area of a metallic sheet such as copper foil, or as the etched upper surface of a printed wiring board, thereby forming a substrate. A typical thickness of the leadframe 201 is about eight mils. While the leadframe 201 is often constructed of copper, alternative electrically conductive materials can be used therefor. The leadframe 201 may provide external connections within and external to the power module as well as a support base for the discrete passive element.

Solder paste is selectively applied or disposed to the leadframe 201 in a thin layer to areas (e.g., a pad of the leadframe 201) for screening processes to provide electrical and mechanical attachment for surface-mount elements such as the discrete passive element. The surface-mount elements such as capacitors may be placed with their conductive ends in the solder paste. The solder paste may be composed of lead-based as well as lead-free compositions.

Above the discrete passive element, a thermally conductive and electrically insulating material 205 is dispensed thereon to form an upper planar surface that acts as a die-attach layer for a semiconductor device 206 that is adhesively bonded thereon. An exemplary thermally conductive and electrically insulating material 205 is epoxy. The adhesive is cured, typically in a controlled thermal process, to secure the semiconductor device 206 to the discrete passive element. An exemplary thermally conductive and electrically insulating material 205 used to mount the semiconductor device 206 onto the discrete passive element is Ablebond 2025D from Ablestik, Rancho Dominguez, Calif. The thermally conductive and electrically insulating material 205 is dispensed (applied) onto the discrete passive element and the semiconductor device 206 is pressed into the thermally conductive and electrically insulating material 205 forcing spreading of the same under the semiconductor device 206 to obtain a minimum of 75% coverage of the bottom surface semiconductor device 206. A curing process in an in-line oven for up to about 45 minutes at about 175 degrees Celsius is used to cure the thermally conductive and electrically insulating material 205.

The semiconductor device 206 is electrically coupled to the patterned leadframe 201 by wire bonds (not shown). The assembly is then encapsulated in a molded package 207, preferably by a thermo-setting encapsulant material such as an epoxy molding compound from Sumikon EME-G770LC from Sumitomo Bakelite, Tokyo, Japan by a transfer molding process to form a surface-mount power module.

Electrical connections to an external circuit are made to the power module by electrically conductive pads formed about the edges of the power module as illustrated and described with reference to FIGS. 4 and 5. In an alternative embodiment, electrical connections are made to the power module by electrically conductive pads (not shown) formed on the lower surface of the power module. The power module may be electrically bonded to an external circuit such as a another circuit board, printed wiring board or substrate using reflow solder techniques in a reflow oven, as is well understood in the art. In an alternative embodiment, the power module may be formed as a through-hole mounted power module employing leads that extend from an outer surface of the power module such as from a side thereof.

In the embodiment illustrated in FIG. 2, heat produced in the semiconductor device 206 is conducted through the thermally conductive and electrically insulated material 205 to the discrete passive element (e.g., through the metallic ends 202 of the main body 203), from which the heat is conducted to the leadframe 201, and then out of the power module. Heat flow is enhanced by the presence of the metallic ends 202 of the discrete passive element, recognizing the generally high thermal conductivity of metallic structures. The metallic ends 202 of the discrete passive element may be tinned as conventionally formed with a base layer of silver, a supplementary base layer of copper, an intermetallic barrier layer of nickel, followed by a solderable surface of tin.

Turning now to FIG. 3, illustrated is an elevational view of an embodiment of a surface-mount power module formed with an extended metallic region 302 of a main body 203 of a discrete passive element constructed according to the principles of the present invention. For purposes of simplicity, analogous elements of the power modules of FIGS. 2 and 3 are designated with the same reference numbers. The extended metallic region 302, which may also be tinned, extends from one of the metallic ends 202 and enhances the thermal conductivity of the heat flow path from a semiconductor device to the leadframe 201, and then to the external environment of the power module. To further enhance the heat flow path, a high heat-producing region 306 of the semiconductor device 206, such as a field-effect transistor, is located above the extended metallic region 302. A lower heat producing region 308 of the semiconductor device 206 may be located above a remaining portion of the main body 203 of the discrete passive element. The remaining elements of the power module of FIG. 3 previously introduced will not be redescribed in the interest of brevity.

Figure 4:
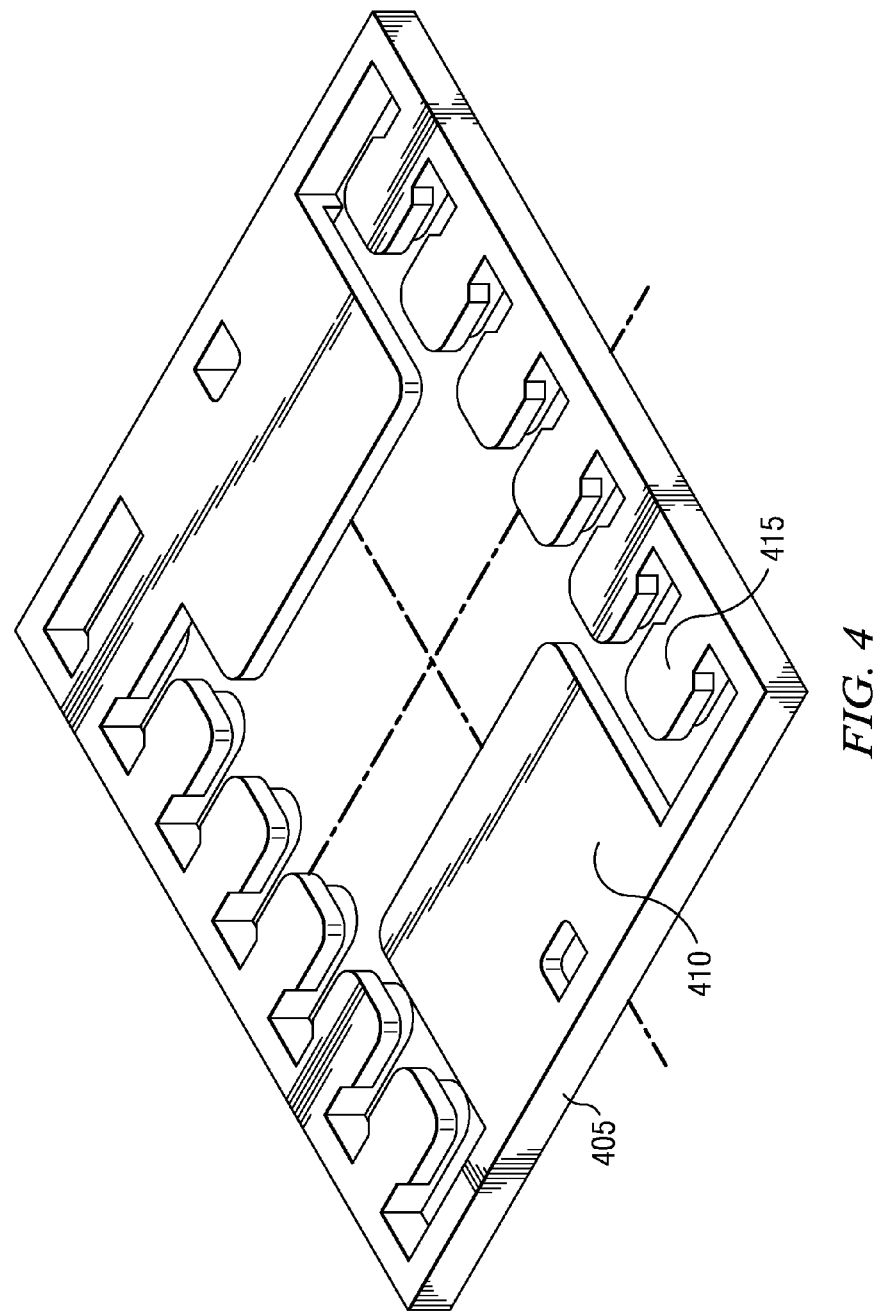
FIGS. 4 to 8 illustrate views of an embodiment of a power module at different stages of completion constructed according to the principles of the present invention.

Turning now to FIGS. 4 to 8, illustrated are views of an embodiment of a power module at different stages of completion constructed according to the principles of the present invention. Beginning with FIG. 4, illustrated is a leadframe 405 that provides the foundation for the power module. In addition to the features described above, the leadframe 405 includes a pad 410 that provides a base for a discrete passive element and electrically conductive leads (one of which is designated 415) that provides electrical connections for a semiconductor device located above the discrete passive element.

Figure 5:
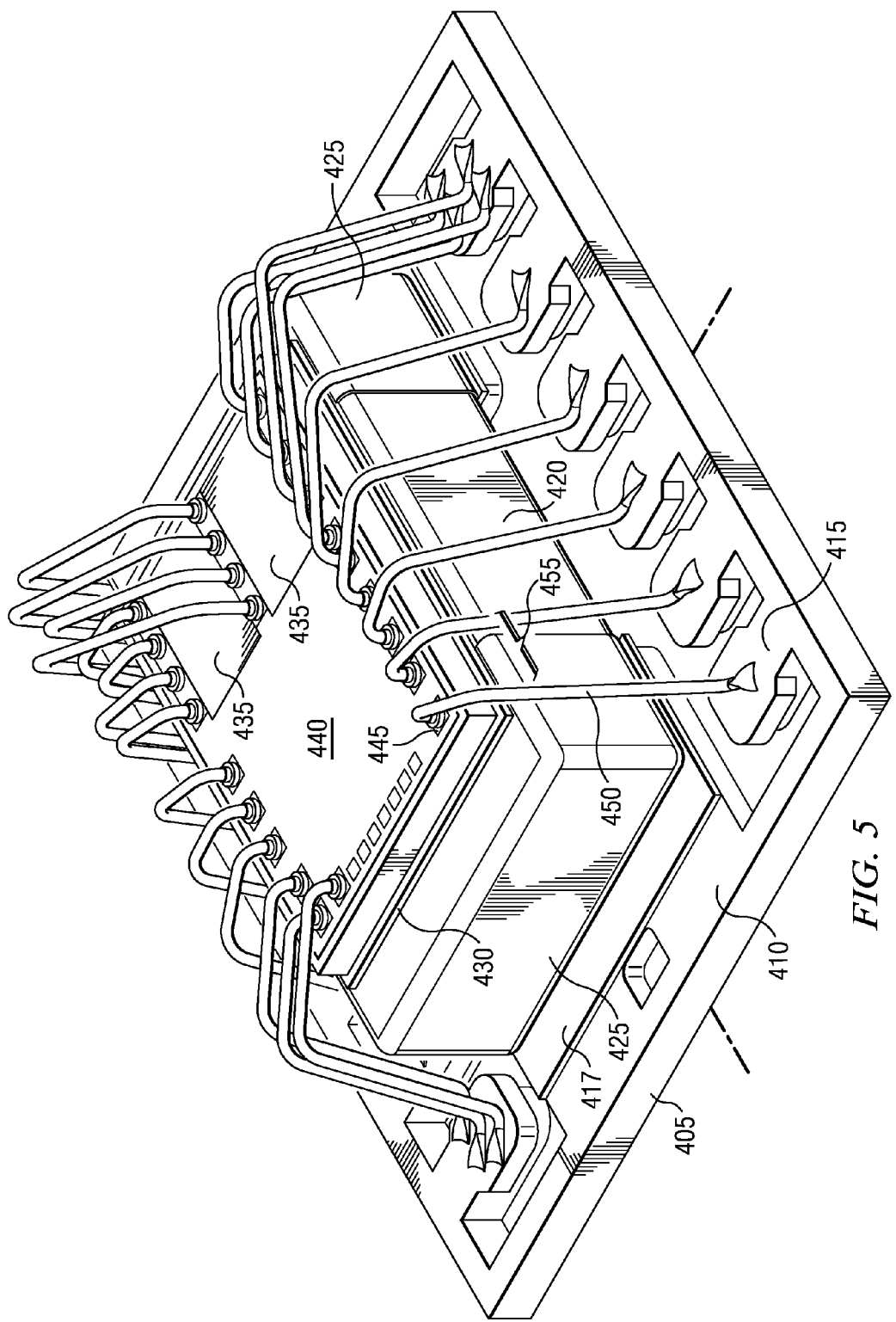

Turning now to FIG. 5, illustrated is an isometric view of an embodiment of the power module with the discrete passive element and semiconductor device constructed on the leadframe 405 of the power module. The discrete passive element includes a main body 420 with a generally planar upper surface and metallic ends 425 and is coupled to the pad 410 of the leadframe 405 via solder paste 417, which is formed on the pad 410 prior to placing the discrete passive element thereon. Above an upper surface of a portion of the discrete passive element is a thermally conductive, electrically insulating layer 430 formed with a planar upper surface.

The semiconductor device formed as an unpackaged semiconductor die includes switches (e.g., metal-oxide semiconductor field-effect transistors) 435 and a controller 440 and is bonded to the upper surface of the thermally conductive, electrically insulating layer 430. Pads, such as pad 445, on an upper surface of the semiconductor device are coupled by wire bonds, such as wire bond 450, to the electrically conductive leads 415 formed on the leadframe 405. The wire bonds 450 are preferably formed of gold wire to provide electrical circuit connections between the pads 445 on the upper surface of the semiconductor device and the electrically conductive leads 415 formed on the leadframe 405. Thermal conductivity of the heat path from the semiconductor device through the thermally conductive, electrically insulating layer 430 is enhanced by an overlapping region 455 of the semiconductor device with the metallic ends 425 of the main body 420 of the discrete passive element. Advantageously, high heat dissipating portions of the semiconductor device are located over or near an overlapping region such as overlapping region 455.

The steps as described above to form a power module generally do not require execution in the highly controlled environment of a clean room. Some steps, however, may be preferably performed in a clean room or other controlled environment such as typically used for assembly of integrated circuits into a molded plastic package, as is generally well known in the art.

Figure 6:
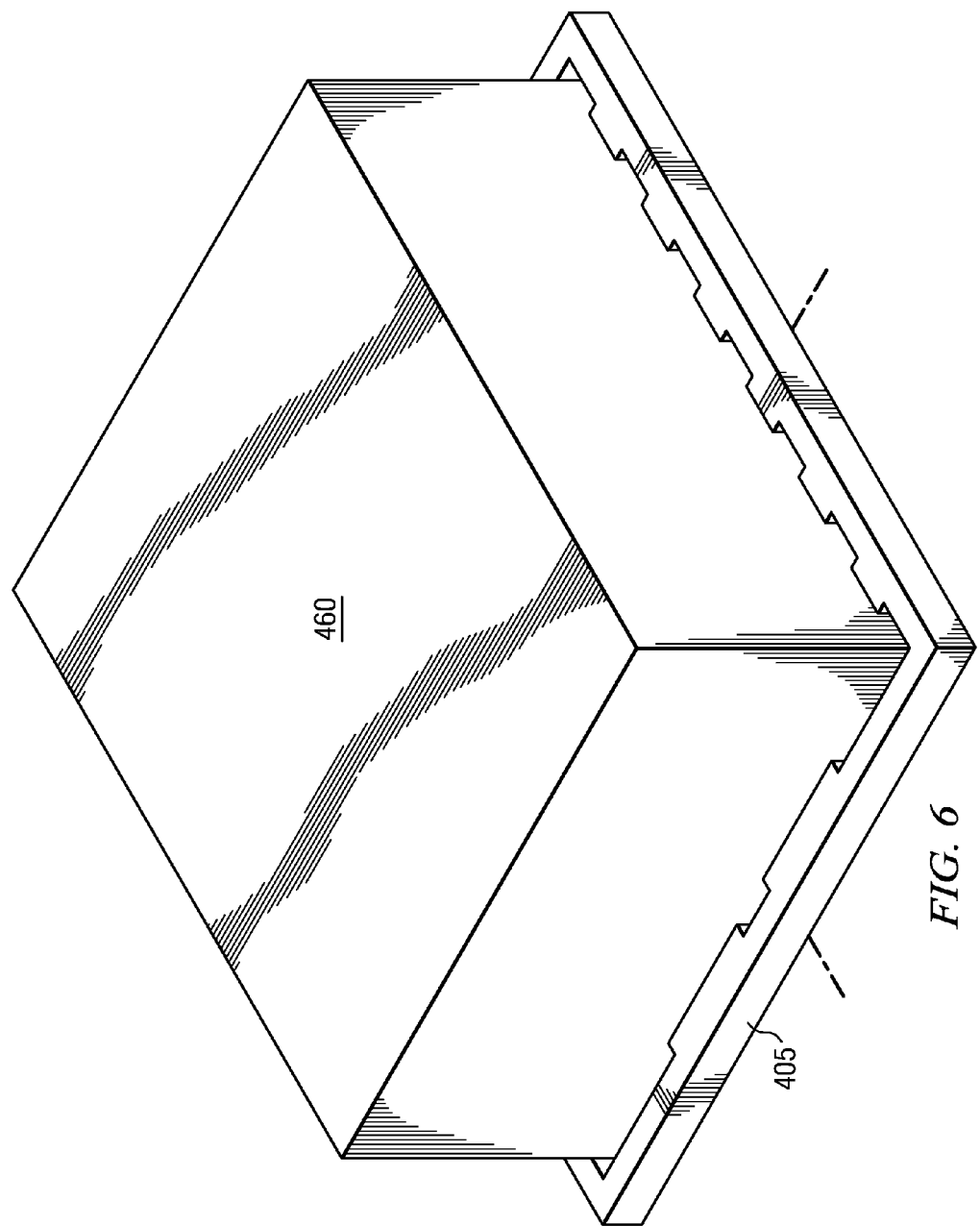

Turning now to FIG. 6, illustrated is an isometric view of an embodiment of the power module after encapsulation by transfer molding with an encapsulant 460 such as an epoxy material constructed according to the principles of the present invention. The ends of the leadframe 405 are exposed about the encapsulant 460 with the electrically conductive leads (not shown) for contact to another circuit board, printed wiring board, substrate or the like.

Figure 7:
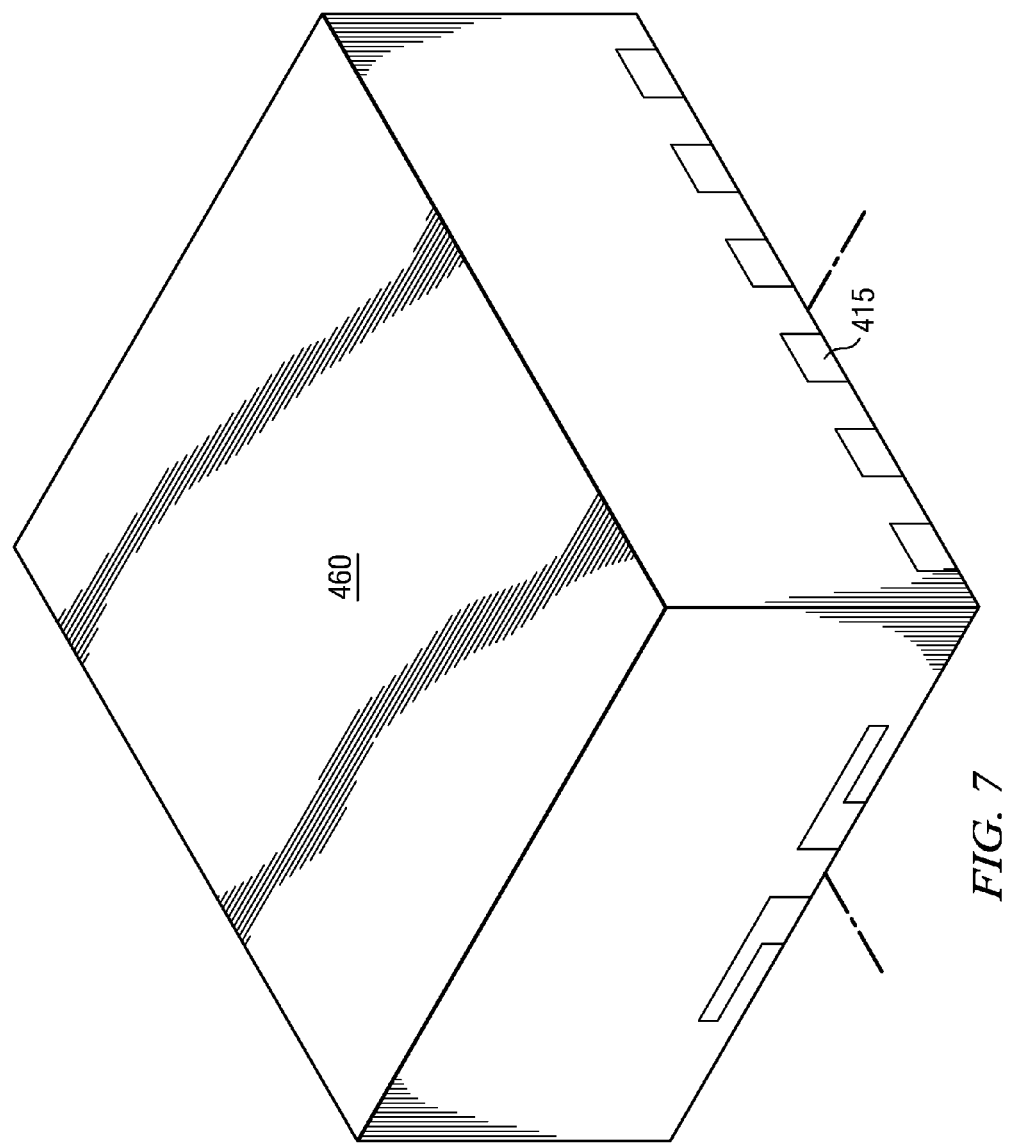
Figure 8:
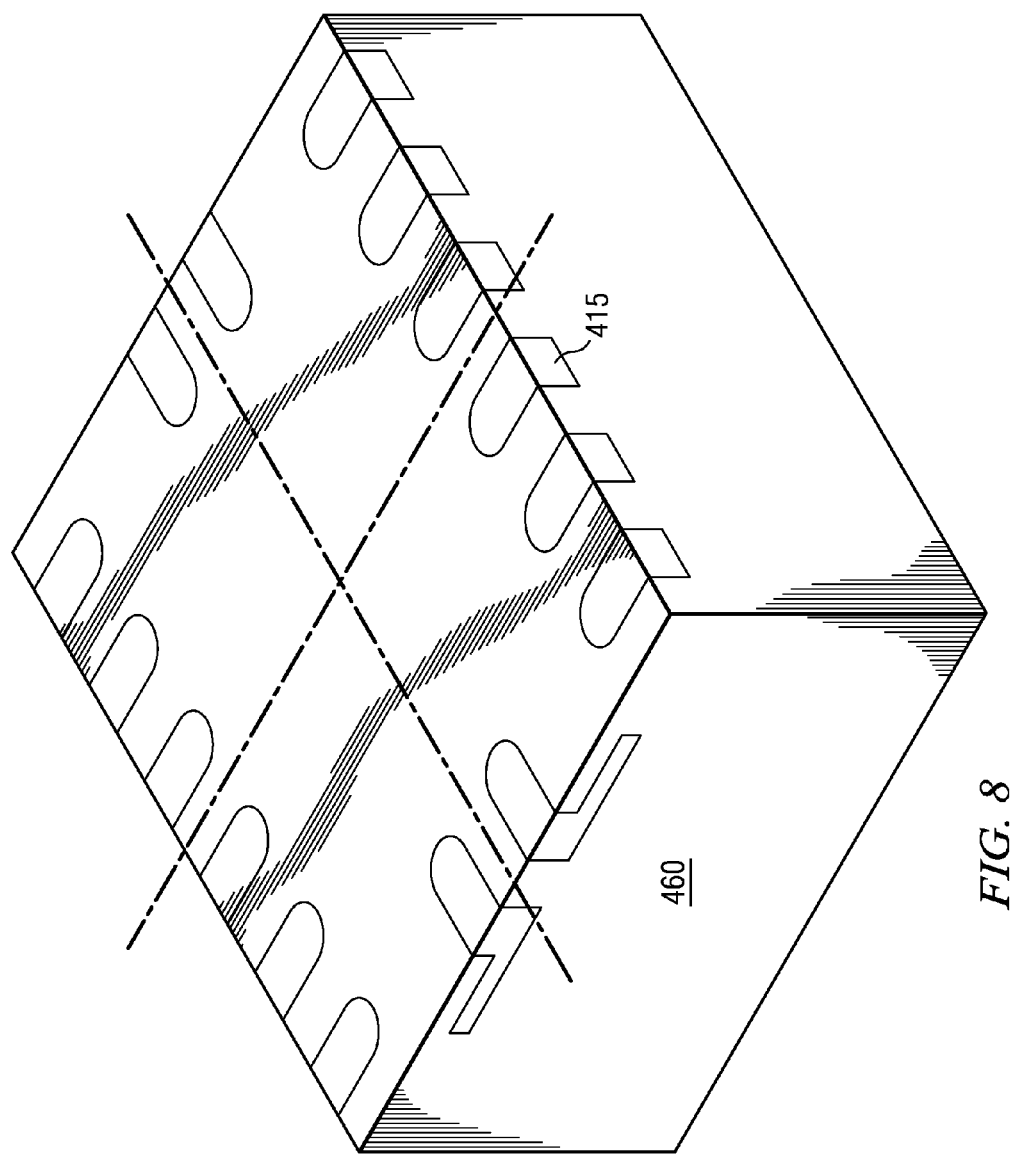

Turning now to FIGS. 7 and 8, illustrated are isometric views of an embodiment of the power module after the ends of the leadframe (not shown) have been removed (such as by sawing) in accordance with the principles of the present invention. The electrically conductive leads or contacts 415 are disposed along the outer edges (see FIG. 7) and lower edges (see FIG. 8) of the power module to enable the power module to be reflow soldered to a printed wiring board in an end product. Typically, the electrically conductive leads or contacts 415 are substantially coplanar with the sides and lower surface of the power module and provide electrical connectivity to an external circuit.

Electrical connections of the power module to the system employing the power module are made by placing the power module on another circuit board, printed wiring board or substrate formed with interconnect pads that are covered with solder paste, generally by a screening operation, and heating the power module on the circuit board in a reflow oven. The reflow soldering operation is generally adequate to provide mechanical attachment of the power module to another circuit board, but other attachment methods such as adhesive compound are well within the broad scope of the present invention.

The exemplary lateral dimensions of the power module as illustrated in FIGS. 4 to 8 are 2.5 millimeters ("mm")×2.25 mm. The height of the module is 1.1 mm. A power module of these dimensions can produce an output current of 1 amperes at 3.3 volts, resulting in a power conversion density of 0.53 watts/cubic-mm ("$W/mm^3$"). Of course, the broad scope of the present invention is not limited to a power module, power converter or the like, having the aforementioned dimensions and ratings, and may be applicable to other electronic devices as well.

In another embodiment of a module such as a power module (e.g., a surface-mount power module) formed with a discrete passive element (e.g., a magnetic device such as an inductor), the inductor is incorporated into a molded package employing processes as introduced herein. The implementation of an inductor allows for simplification of construction of the power module (e.g., power module formed as a power converter) that in turn enables simplification of conventional manufacturing steps, advantageously resulting in a lower manufacturing cost with reduction in product size.

In an embodiment, the magnetic core of the inductor is assembled into the end product separately from the electrically conductive coil (also referred to as "coil"). The magnetic core and the coil are formed as two physically independent structures that are brought together when the inductor and/or power module are assembled. In a first structure, an electrically conductive coil is formed on a printed wiring board or a substrate of a molded package. In a second structure, a magnetic material is deposited on to a non-electrically conductive carrier (also referred to as a "carrier") such as a substantially undoped silicon die that is then placed on the printed wiring board or substrate.

The two physically independent structures form an inductor without the need for a manufacturing process that separately combines the two structures. When the two structures are brought physically close to each other, the magnetic coupling between the two structures produces an inductance with physical, electrical, and magnetic characteristics suitable for operation of a circuit such as a power converter.

The electrically conductive coil is formed according to design rules and manufacturing steps permitted by an integrated circuit assembly process for the printed wiring board or substrate. The coil is directly electrically coupled to the remaining circuit elements (e.g., switches) of, for instance, the power converter through conventional connection package points such as by means of wire bonds, solder bumps, or other integrated circuit package assembly techniques. No coil terminations, solderable leads, crimped conductors, or other inductor terminations are needed, since the coil is independently fabricated in a different process step than that used to form the magnetic core.

The second structure (e.g., the magnetic core) is formed using a non-magnetic and non-electrically conductive carrier such as a substantially undoped silicon wafer that is subjected to a deposition process that, after dicing, produces a magnetic layer/film with desired magnetic properties in the end package. The magnetic core formed as a diced die with desired magnetic characteristics is placed proximate such as above, parallel, and/or adjacent to the portion of the printed wiring board or substrate on which the coil has been formed. The proximity of these two structures produces desired inductive properties for the coil by virtue of presence of appropriately chosen magnetic material on the carrier. Alternately, the magnetic core can be implemented using a ceramic ferrite piece part that can be formed by conventional press and fire techniques, and placed proximate to the coil in the end package. The ceramic ferrite piece part may be bonded to the printed wiring board or substrate by depositing epoxy dots on the surface thereof, pressing the magnetic core onto the dots, and then curing the epoxy.

In the case where the carrier is a silicon die, the magnetic core is formed by deposition of a suitably chosen magnetic thin-film material, preferably with a high magnetic permeability, on the surface of the silicon die to a desired thickness. Deposition methods include electro-chemical deposition and vacuum sputter deposition. The choice of materials is wide including metallic alloys including iron, cobalt, and nickel. An advantageous alloy is one containing iron and cobalt. Other alloys include, without limitation, various alloys of iron, cobalt and nickel, including alloys of iron and nitrogen or iron and nickel.

Deposition of the magnetic material may also be performed employing a plating process. In such a plating process, a thin, seed layer of a conductive material is sputtered or deposited by an electroless plating process on to a silicon die. A thicker layer of the magnetic material is then deposited or electroplated on to the seed layer employing conventional electroplating techniques. A photoresist and patterning process may be employed to define an area of deposition for the seed layer. For an example of a magnetic device, see U.S. Publication No. 2009/0068400 A1, entitled "Micromagnetic Device and Method of Forming the Same," to Lotfi, et al., published Mar. 12, 2009, which is incorporated herein by reference. The power control and processing functions are implemented in a semiconductor device such as another silicon die that is placed over the magnetic core, thereby creating a power module in an integrated molded package.

Figure 9:
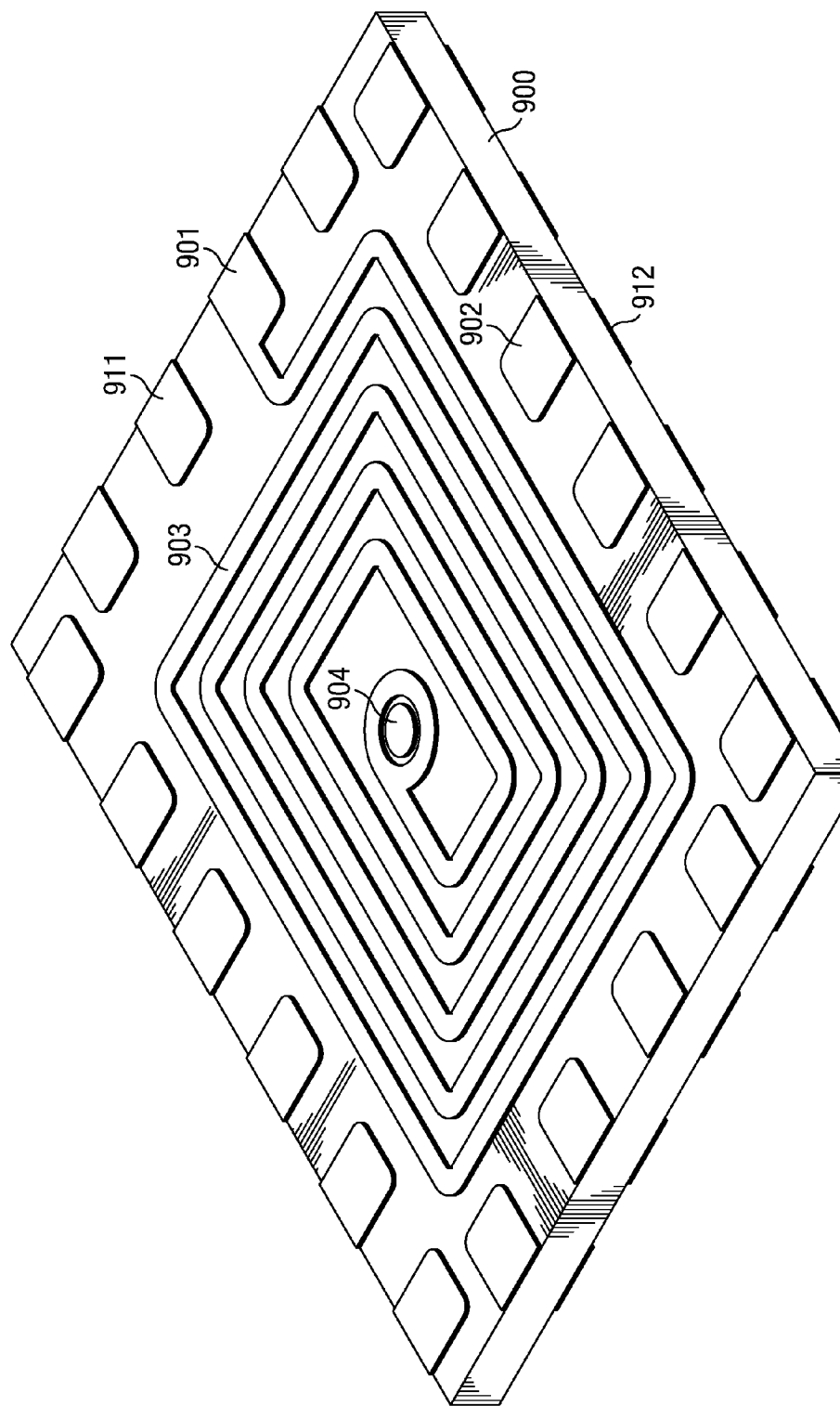
FIGS. 9 to 13 illustrate views of a yet another embodiment of a power module at different stages of completion constructed according to the principles of the present invention.

Turning now to FIGS. 9-13, illustrated are views of an embodiment of a power module at different stages of completion constructed according to the principles of the present invention. Referring now to FIG. 9, illustrated is a printed wiring board or substrate 900 with a patterned conductor such as a spirally shaped conductor 903 formed on an upper surface thereof. The spirally shaped conductor 903 may be formed as a substantially circular spiral pattern or as a spiral pattern with rectilinear segments as illustrated in FIG. 9. It should be understood that a leadframe may be employed in lieu of the printed wiring board 900 in accordance with the power module.

Conductive lands are formed around the periphery of the printed wiring board 900. The upper conductive lands 901, 902, 911 are formed on the upper surface of the printed wiring board 900 and a lower conductive land 912 is formed on an opposing (lower) surface of the printed wiring board 900. The upper conductive lands (e.g., the upper conductive land 902) are coupled by an electrically conductive via to the lower conductive lands (e.g., the lower conductive land 912) on the opposing (lower) surface of the printed wiring board 900. An edge of the lower conductive land 912 is visible in FIG. 9. The vias coupling the conductive lands on opposing surfaces of the printed wiring board are formed within the printed wiring board and are not visible in FIG. 9.

One terminal of the spirally shaped conductor 903 terminates on the upper conductive land 901. An electrically conductive via 904 couples another terminal of the spirally shaped conductor 903 to a terminal of another spirally shaped conductor (not shown) formed with a winding sense (e.g., the same winding sense) on the opposing (lower) surface of the printed wiring board 900. The spirally shaped conductor formed on the opposing (lower) surface of the printed wiring board 900 with the same winding sense produces a magnetic field in the same direction as a magnetic field produced by the spirally shaped conductor 903 formed on the upper surface of the printed wiring board 900 by a current flowing serially through both spirally shaped conductors. Another terminal of the another spirally shaped conductor terminates on a lower conductive land (not shown) on the opposing (lower) surface of the printed wiring board 900, such as a lower conductive land on the opposing (lower) surface of the printed wiring board 900 under the upper conductive land 911.

The conductive lands on the opposing (lower) surface of the printed wiring board 900 form external terminals, contacts or leads for the power module. The insulating material of the printed wiring board 900 is preferably formed, without limitation, of "BT" material, which is a high-temperature insulating material commonly used in the art to form printed wiring boards. An alternative insulating material for the printed wiring board 900 is "FR4." The patterned conductor (e.g., the spirally shaped conductor 903) of the printed wiring board 900 is formed as a layer of copper such as a two-ounce layer of copper. The spirally shaped conductor 903 is typically overlaid with a thin film of gold to accommodate a soldering or a wire-bonding operation in a later manufacturing step. The printed wiring board 900 may be formed as an array of devices on a larger printed wiring board that may then be sawed in a later manufacturing step to form portions of the power module illustrated in FIG. 9.

Figure 10:
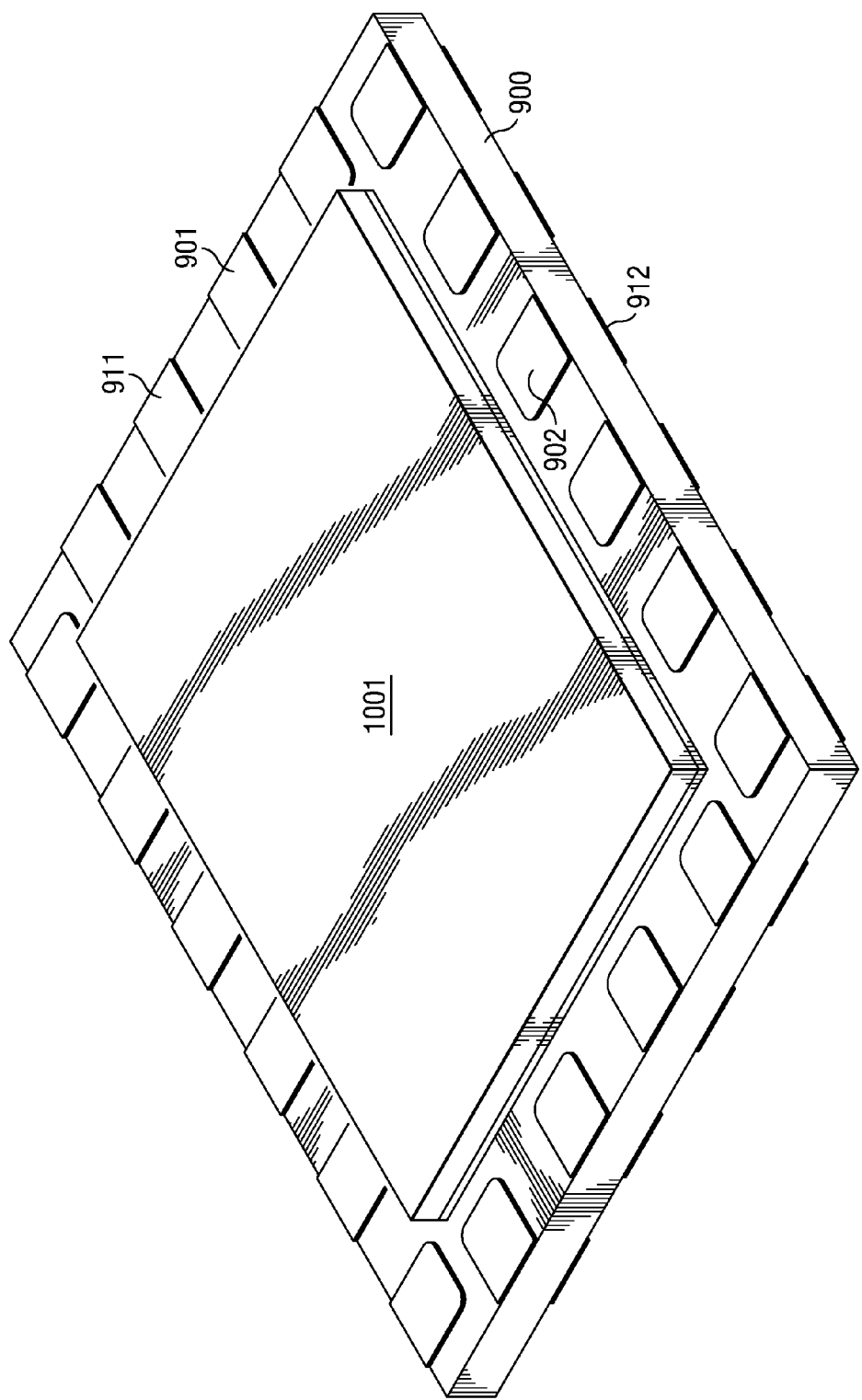

Turning now to FIG. 10, illustrated is a view of the power module with magnetic core 1001 placed above the printed wiring board 900. The magnetic core 1001 mounted on the upper surface of the printed wiring board 900 is located proximate the spirally shaped conductor 903. The magnetic core 1001 may be bonded to the printed wiring board 900 by depositing epoxy dots on the upper surface thereof, pressing the magnetic core 1001 on to the epoxy dots, and then curing the epoxy dots. Preferably, a sufficient volume of epoxy is deposited on the upper surface of the printed wiring board 900 so that a substantially continuous layer of epoxy is formed after the magnetic core 1001 is placed and pressed into the epoxy dots.

The magnetic core 1001 that is advantageously formed with a relatively high magnetic permeability material is operative to produce a "magnetic mirror" effect wherein a substantial portion of the magnetic flux produced in accordance with the spirally shaped conductor 903 is conducted within the volume of the magnetic core 1001. The magnetic mirror effect generally constrains the magnetic flux that is produced below the printed wiring board 900 to an area substantially beneath the magnetic core 1001. If the magnetic permeability of the magnetic core 1001 is sufficiently high, relatively little flux is produced in the region above the magnetic core 1001 compared to the magnetic flux produced in the magnetic core 1001. In this manner, the inductance of the spirally shaped conductor 903 is substantially doubled in comparison to a similarly formed winding without an overlying magnetic core 1001, and the region of the magnetic flux is practically constrained to an area near and including the magnetic core 1001.

Figure 11:
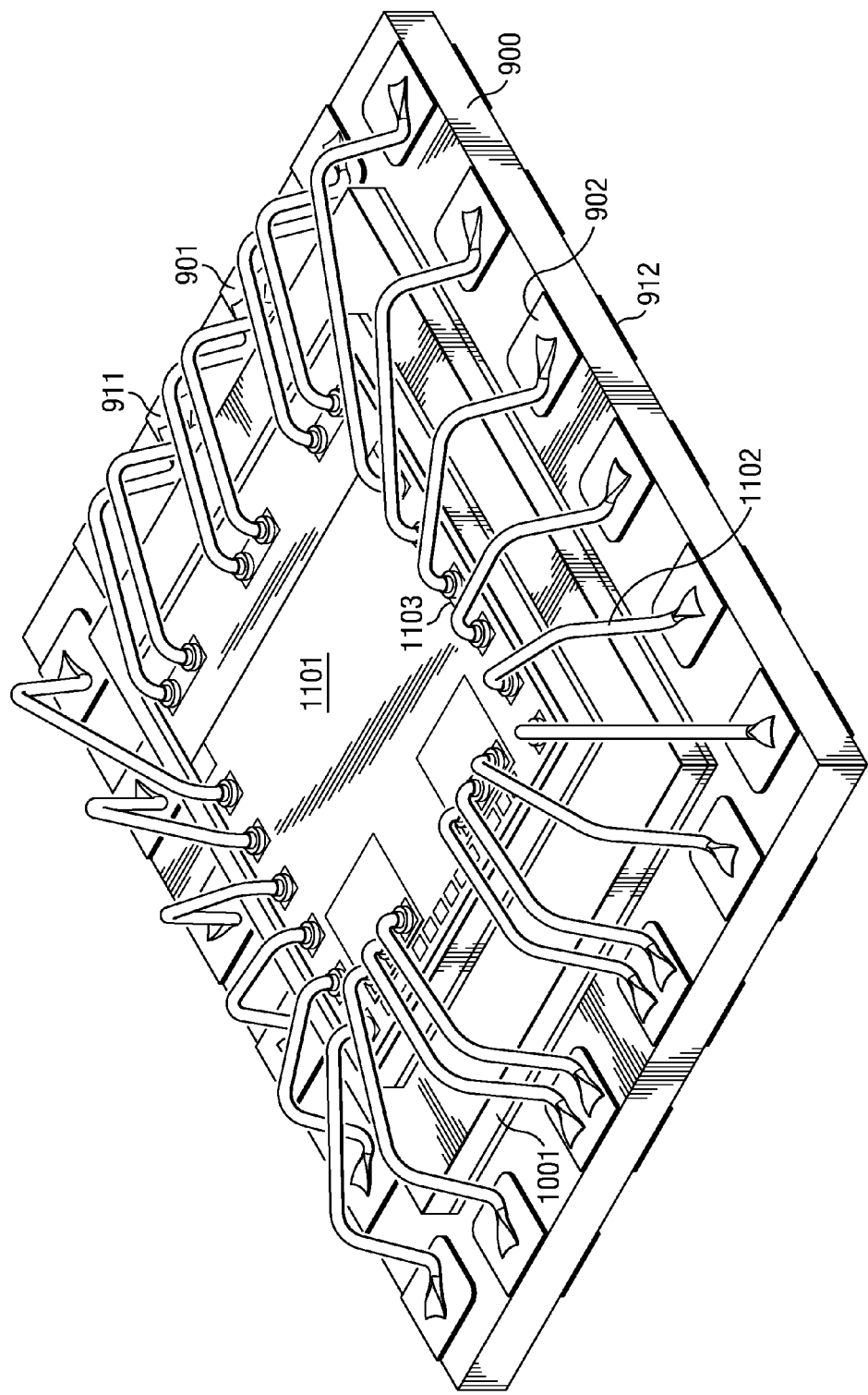

Turning now to FIG. 11, illustrated is a view of the power module with a semiconductor device 1101 formed as an unpackaged semiconductor die mounted on an upper surface of the magnetic core 1001. The semiconductor device 1101 may include, without limitation, active and passive elements, and circuits such as the controller 120, the driver 130, and the main and auxiliary switches $Q_{mn}$ and $Q_{aux}$ illustrated and described with reference to FIG. 1. The semiconductor device 1101 is formed with electrically conductive pads (also referred to as "pads") such as pad 1103 on an upper surface thereof The pads are coupled by wire bonds (e.g., wire bond 1102) to the upper conductive lands on the printed wiring board 900. The semiconductor device 1101 is bonded to the magnetic core 1001 by deposition of epoxy dots on an upper surface of the magnetic core 1001, pressing the semiconductor device 1101 on to the epoxy dots, and curing the epoxy dots.

Figure 12:
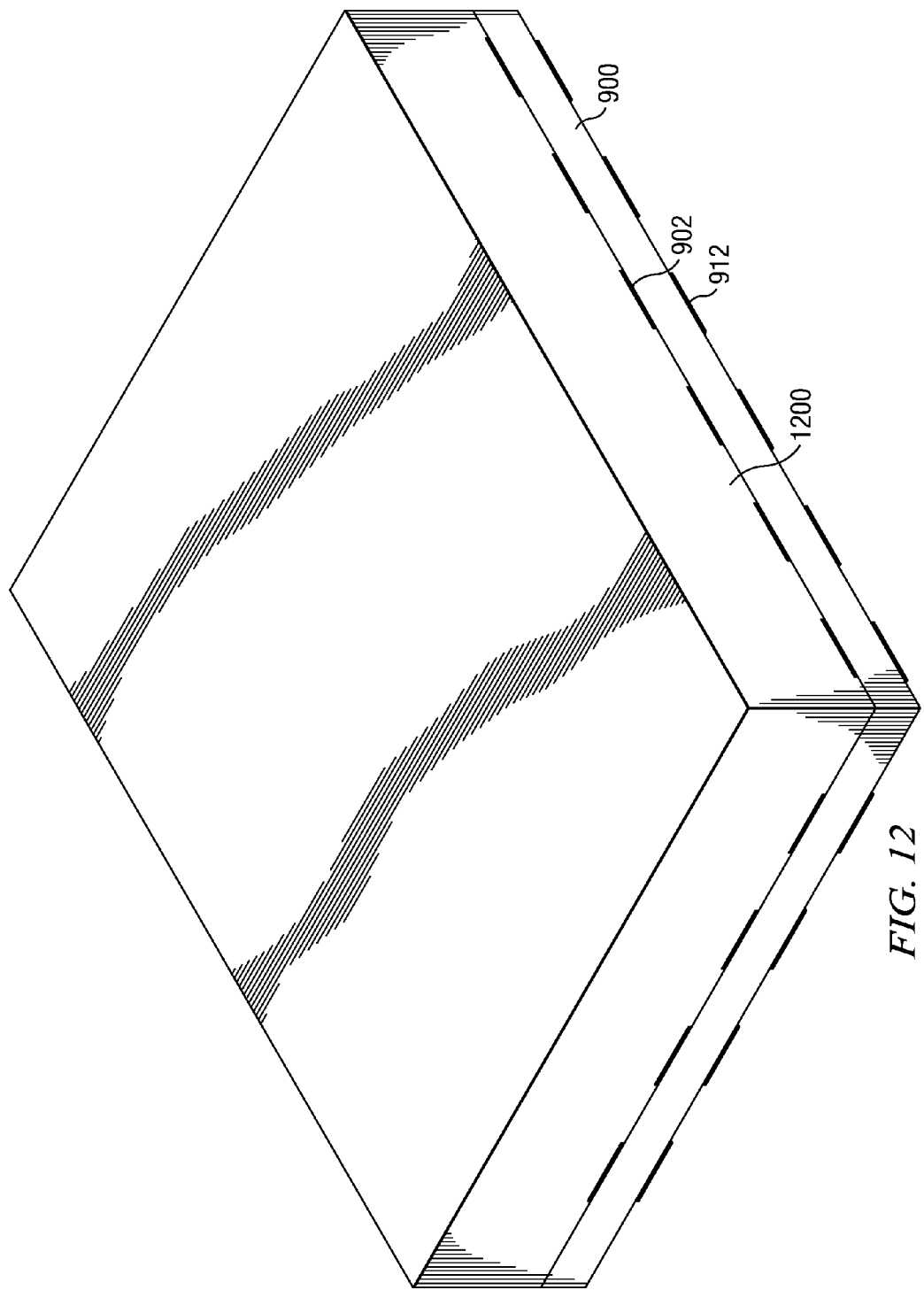

Turning now to FIG. 12, illustrated is a top view of the power module after encapsulation by transfer molding with an encapsulant 1200 such as an epoxy material, constructed according to the principles of the present invention. The ends of the conductive lands 902, 912 in the encapsulant 1200 are visible in FIG. 12. Conductive lands on the bottom of the power module such as conductive land 912 provide external connections to another circuit board, printed wiring board, substrate, or the like.

Figure 13:
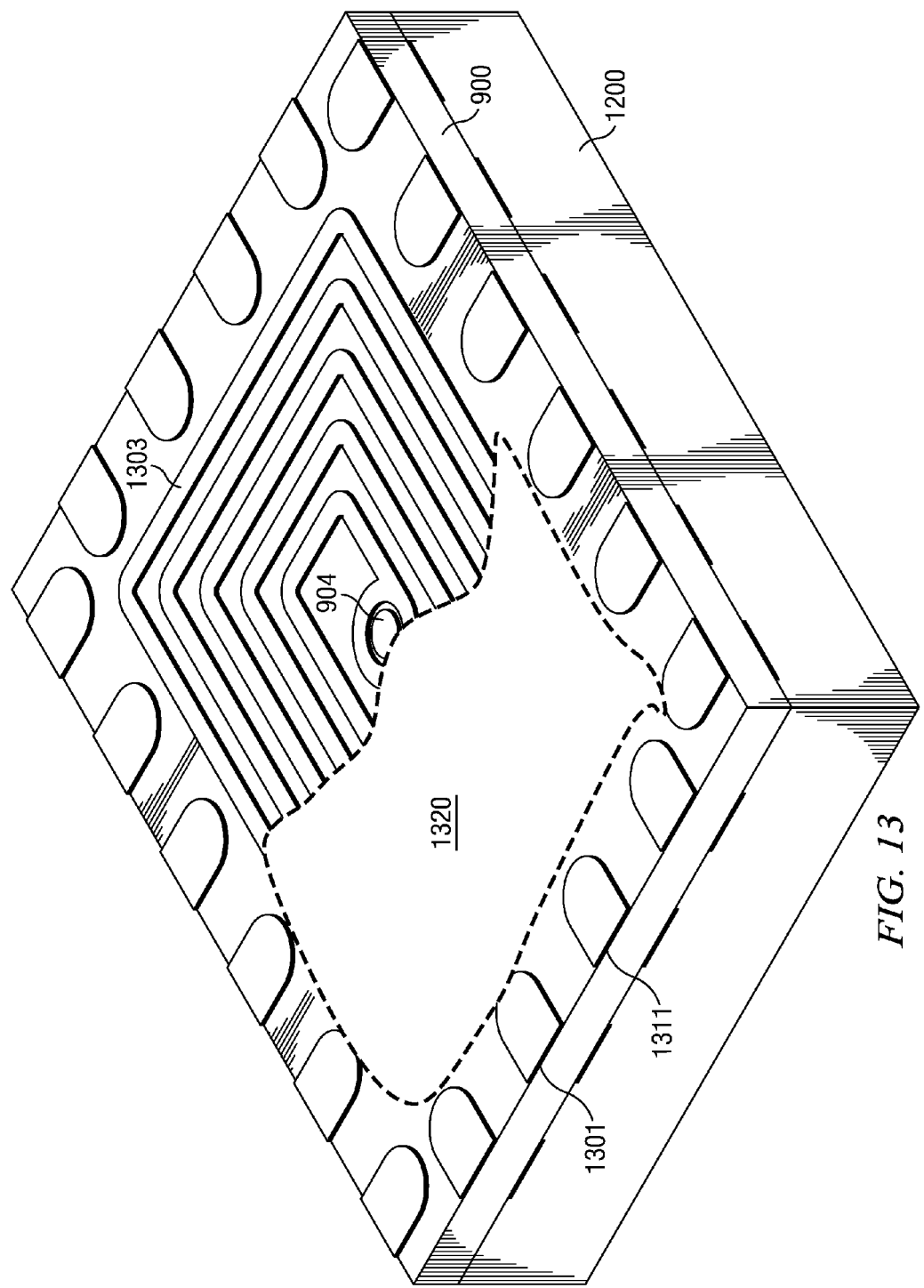

Turning now to FIG. 13, illustrated is a bottom view of the power module after encapsulation with the encapsulant 1200 by transfer molding. As illustrated in FIG. 13, lower conductive lands such as lower conductive lands 1301, 1311 formed on the lower surface of the printed wiring board provide the external terminals, contacts or leads. Another spirally shaped conductor 1303 is formed with the same winding sense as spirally shaped conductor 903 formed on the upper surface of the printed wiring board 900 as described previously hereinabove. A terminal of spirally shaped conductor 1303 is coupled to a terminal of spirally shaped conductor 903 by means of the via 904. Preferably, a solder mask or other insulating material (a portion of which is designated 1320) is deposited on the lower surface of the power module and patterned to cover the spirally shaped conductor 1303 and the via 904, and to contain the flow of solder in a later soldering operation to couple the power module to an external circuit. The insulating material 1320 is patterned to expose the lower conductive lands such as the lower conductive lands 1301, 1311.

Electrical connections of the power module to a system employing the power module are made by placing the power module on another circuit board or printed wiring board formed with interconnect pads that are covered with solder paste, generally by a screening operation, and heating the power module on the circuit board in a reflow oven. The reflow soldering operation is generally adequate to provide mechanical attachment of the power module to another circuit board, but other attachment methods such as by an adhesive compound are well within the broad scope of the present invention. The exemplary lateral dimensions of the power module as illustrated in FIGS. 9 to 13 are 3 mm by 3 mm. The height of the module is 0.8 mm. A power module of these dimensions can produce an output current of 2 amperes at 3.3 volts, resulting in a power conversion density of 0.5-1.0 $W/mm^3$ or 8,000-16,000 $W/in^3$.

Thus, a power module and a method of manufacture thereof with readily attainable and quantifiable advantages have been introduced. Those skilled in the art should understand that the previously described embodiments of the power module are submitted for illustrative purposes only. In addition, other embodiments capable of producing a power module while addressing compact, efficient, and high density power modules, while being manufacturable at high volume and with lower cost than is achieved with the prior art are well within the broad scope of the present invention. While the power module has been described in the environment of electronic power conversion, the module may also be incorporated into other electronic devices, systems or assemblies such as entertainment, motor control, or computing devices, or into other devices wherein a compact module is required that can be assembled advantageously at low cost.

For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G. Kassakian, M. F. Schlecht and G. C. Verghese, Addison-Wesley (1991). For a better understanding of magnetic devices, see "Soft Ferrites: Properties and Applications," by E. C. Snelling, published by Butterworth-Heinemann, Second Edition, 1989. The aforementioned references are incorporated herein by reference in their entirety.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a stacked module having a magnetic core and a semiconductor device, comprising:
providing a printed wiring board;
forming a patterned conductor on an upper surface of said printed wiring board;
mounting a magnetic core having a relatively high magnetic permeability on said upper surface of said printed wiring board proximate said patterned conductor; and
mounting a semiconductor device directly above an upper surface of said magnetic core.

2. The method as recited in claim 1 wherein said patterned conductor is a spirally shaped conductor.

3. The method as recited in claim 1 further comprising forming upper conductive lands around a periphery of said upper surface of said printed wiring board and lower conductive lands around a periphery of a lower surface of said printed wiring board, wherein ones of said lower conductive lands form external terminals for said module.

4. The method as recited in claim 1 further comprising forming an upper conductive land on said upper surface of said printed wiring board coupled by an electrically conductive via to a lower conductive land formed on a lower surface of said printed wiring board.

5. The method as recited in claim 1 wherein a terminal of said patterned conductor terminates on an upper conductive land formed on said upper surface of said printed wiring board and another terminal of said patterned conductor is coupled by an electrically conductive via to a terminal of another patterned conductor formed on a lower surface of said printed wiring board.

6. The method as recited in claim 5 wherein another terminal of said another patterned conductor terminates on a lower conductive land formed on said lower surface of said printed wiring board.

7. The method as recited in claim 6 further comprising depositing an insulating material on said lower surface of said printed wiring board over said another patterned conductor and said electrically conductive via.

8. The method as recited in claim 1 wherein said patterned conductor is formed with a layer of copper overlaid with a thin film of gold.

9. The method as recited in claim 1 wherein mounting said magnetic core includes depositing epoxy dots on said upper surface of said printed wiring board, pressing said magnetic core on to said epoxy dots and then curing said epoxy dots.

10. The method as recited in claim 1 further comprising forming said magnetic core by depositing a magnetic material on to a non-electrically conductive carrier in a molded package.

11. The method as recited in claim 10 wherein said non-electrically conductive carrier is a substantially undoped silicon die.

12. The method as recited in claim 1 further comprising forming said magnetic core by depositing a seed layer of a conductive material on to a non-electrically conductive carrier and a magnetic thin-film material on to said seed layer in a molded package.

13. The method as recited in claim 12 wherein said magnetic thin-film material includes a metallic alloy.

14. The method as recited in claim 13 wherein said metallic alloy includes ones of iron, cobalt, and nickel.

15. The method as recited in claim 1 wherein said magnetic core is formed with a relatively high magnetic permeability material operative to produce a magnetic minor effect wherein a substantial portion of a magnetic flux produced in accordance with said patterned conductor is conducted within a volume of said magnetic core.

16. The method as recited in claim 1 further comprising forming said magnetic core as a ceramic ferrite piece part in a molded package.

17. The method as recited in claim 1 further comprising coupling a pad formed on an upper surface of said semiconductor device with a wire bond to an upper conductive land formed on said upper surface of said printed wiring board.

18. The method as recited in claim 1 wherein mounting said semiconductor device includes depositing epoxy dots on said upper surface of said magnetic core, pressing said semiconductor device on to said epoxy dots and then curing said epoxy dots.

19. The method as recited in claim 1 wherein said module is a power module and said semiconductor device includes at least one switch and a controller therefor.

20. The method as recited in claim 1 further comprising encapsulating portions of said printed wiring board, said magnetic core and said semiconductor device with an encapsulant.

* * * * *